(12) United States Patent
Fuchs et al.

(10) Patent No.: US 9,786,044 B2
(45) Date of Patent: Oct. 10, 2017

(54) METHOD OF MEASURING ASYMMETRY, INSPECTION APPARATUS, LITHOGRAPHIC SYSTEM AND DEVICE MANUFACTURING METHOD

(71) Applicant: ASML NETHERLANDS B.V., Veldhoven (NL)

(72) Inventors: Andreas Fuchs, Meerbusch (DE); Peter Hanzen Wardenier, Eindhoven (NL); Amandev Singh, Eindhoven (NL); Maxime D'Alfonso, Veldhoven (NL); Hilko Dirk Bos, Utrecht (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/971,887

(22) Filed: Dec. 16, 2015

(65) Prior Publication Data
US 2016/0180517 A1     Jun. 23, 2016

(30) Foreign Application Priority Data
Dec. 19, 2014    (EP) .................................. 14199200

(51) Int. Cl.
G06K 9/00       (2006.01)
G06T 7/00       (2017.01)
(Continued)

(52) U.S. Cl.
CPC ........ *G06T 7/0004* (2013.01); *G03F 7/70633* (2013.01); *G03F 7/70941* (2013.01); *G06T 7/11* (2017.01); *G06T 2207/30148* (2013.01)

(58) Field of Classification Search
None
See application file for complete search history.

(56) References Cited

U.S. PATENT DOCUMENTS 5,576,829 A * 11/1996 Shiraishi ................ G01N 21/88
                                                  356/432
6,862,076 B2 * 3/2005 Mulder ............... G03F 7/70941
                                                  355/40
(Continued)

FOREIGN PATENT DOCUMENTS

KR           100510592        8/2005
TW          201226891 A1     7/2012
(Continued)

OTHER PUBLICATIONS

Taiwanese Office Action dated Nov. 21, 2016 in corresponding Taiwan Patent Application No. 104142816.

*Primary Examiner* — Andrae S Allison
(74) *Attorney, Agent, or Firm* — Pillsbury Winthrop Shaw Pittman LLP

(57) ABSTRACT

A scatterometer is used in a dark-field imaging mode to measure asymmetry-related parameters such as overlay. Measurements of small grating targets are made using identical optical paths, with the target in two orientations to obtain separate measurements of +1 and −1 diffraction orders. In this way, intensity scaling differences (tool asymmetry) are avoided. However, additive intensity defects due to stray radiation (ghosts) in the optical system cannot be avoided. Additive intensity issues strongly depend on the ratio between 0th and 1st order diffraction and are therefore strongly substrate (process) dependent. Calibration measurements are made on a few representative target gratings having biases. The calibration measurements are made, using not only different substrate rotations but also complementary apertures. Corrections are calculated and applied to correct asymmetry, to reduce error caused by stray radiation.

20 Claims, 7 Drawing Sheets

(51) Int. Cl.
  *G03F 7/20*    (2006.01)
  *G06T 7/11*    (2017.01)

(56) References Cited

U.S. PATENT DOCUMENTS

| | | | |
|---|---|---|---|
| 7,656,518 | B2 | 2/2010 | Den Boef et al. |
| 7,791,727 | B2 | 9/2010 | Den Boef et al. |
| 7,791,732 | B2 | 9/2010 | Den Boef et al. |
| 8,339,595 | B2 | 12/2012 | Den Boef |
| 8,411,287 | B2 | 4/2013 | Smilde et al. |
| 8,705,007 | B2 | 4/2014 | Cramer et al. |
| 8,786,825 | B2 | 7/2014 | Van De Kerkhof et al. |
| 8,867,020 | B2 | 10/2014 | Smilde et al. |
| 8,948,495 | B2 * | 2/2015 | Marcuccilli ........... G06T 7/0004 382/149 |
| 9,081,303 | B2 | 7/2015 | Cramer et al. |
| 9,110,385 | B2 | 8/2015 | Den Boef |
| 9,134,256 | B2 | 9/2015 | Smilde et al. |
| 9,140,998 | B2 | 9/2015 | Smilde et al. |
| 2006/0033921 | A1 | 2/2006 | Den Boef et al. |
| 2006/0066855 | A1 | 3/2006 | Den Boef et al. |
| 2010/0201963 | A1 | 8/2010 | Cramer et al. |
| 2010/0328655 | A1 | 12/2010 | Den Boef |
| 2011/0027704 | A1 | 2/2011 | Cramer et al. |
| 2011/0043791 | A1 | 2/2011 | Smilde et al. |
| 2011/0069292 | A1 | 3/2011 | Den Boef |
| 2011/0102753 | A1 | 5/2011 | Van De Kerkhof et al. |
| 2012/0038910 | A1 | 2/2012 | Stevens et al. |
| 2012/0044470 | A1 | 2/2012 | Smilde et al. |
| 2012/0123581 | A1 * | 5/2012 | Smilde ................ G03F 7/70483 700/105 |
| 2012/0242970 | A1 * | 9/2012 | Smilde ................ G03F 7/70483 355/77 |
| 2013/0258310 | A1 | 10/2013 | Smilde et al. |
| 2013/0271740 | A1 | 10/2013 | Quintanilha |
| 2013/0308142 | A1 * | 11/2013 | Straaijer ................ G01B 11/24 356/625 |
| 2015/0185625 | A1 * | 7/2015 | Chen .................... G03F 7/70633 702/182 |
| 2016/0086324 | A1 * | 3/2016 | Bozkurt ................ G06T 7/0004 382/145 |

FOREIGN PATENT DOCUMENTS

| | | |
|---|---|---|
| TW | 201229496 A1 | 7/2012 |
| WO | 2013/178422 | 12/2013 |

* cited by examiner $$A = (I_{+1}^0 - I_{-1}^\pi)$$ Figure 3F $$OV = f(A_{-d}, A_{+d})$$ Figure 4C

METHOD OF MEASURING ASYMMETRY, INSPECTION APPARATUS, LITHOGRAPHIC SYSTEM AND DEVICE MANUFACTURING METHOD

This application claims priority to European patent application no. EP14199200.8, filed Dec. 19, 2014, which is incorporated herein in its entirety by reference.

FIELD

The present description relates to methods and apparatus for metrology usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in United States patent application publication nos. US 2006-033921 and US 2010-201963. The targets used by such scatterometers are relatively large, e.g., 40 μm by 40 μm, gratings and the measurement beam generates a spot that is smaller than the grating (i.e., the grating is underfilled). In addition to measurement of feature shapes by reconstruction, diffraction based overlay can be measured using such apparatus, as described in U.S. patent application publication no. US 2006-066855. Diffraction-based overlay metrology using dark-field imaging of the diffraction orders enables measurement of overlay and other parameters on smaller targets. These targets can be smaller than the illumination spot and may be surrounded by product structures on a substrate. The intensities from the environment product structures can efficiently be separated from the intensities from the overlay target with the dark-field detection in the image-plane.

Examples of dark field imaging metrology can be found in U.S. patent application publications nos. US 2010-0328655 and US 2011-069292, which documents are hereby incorporated by reference in their entirety. Further developments of the technique have been described in U.S. patent application publication nos. US 2011-0027704, US 2011-0043791, US 2011-102753, US 2012-0044470, US 2012-0123581, US2012-0242970, US 2013-0258310, US 2013-0271740 and in PCT patent application publication no. WO 2013-178422. Typically in these methods it is desired to measure asymmetry as a property of the target. Targets can be designed so that measurement of asymmetry can be used to obtain measurement of various performance parameters such as overlay, focus or dose. Asymmetry of the target is measured by detecting differences in intensity between opposite portions of the diffraction spectrum using the scatterometer. For example, the intensities of +1 and −1 diffraction orders may be compared, to obtain a measure of asymmetry.

In some of these prior patent application publications, it is proposed to perform dark-field metrology using different illumination modes and/or different image detection modes to obtain the +1 and −1 diffraction orders from periodic structures (gratings) within the target. On the other hand, such methods are susceptible to asymmetry in the optical paths used in the different modes, which will result in errors when measuring the asymmetry of the target. Accordingly, although various calibrations and corrections can be applied to reduce these errors, it is generally the case that best overlay measurement results are obtained if the target is measured twice under identical conditions of illumination and detection. To do this, for example, the substrate is rotated 180 degrees between measurements, to obtain the −1 and the +1 diffraction order intensities in turn. This mode of asymmetry measurement may therefore be referred to as a substrate rotation mode. The use of exactly the same optical path for both measurements ensures that any difference between the measured intensities is due to target properties, not properties of the scatterometer.

SUMMARY

While use of a substrate rotation mode substantially eliminates errors due to asymmetry in the instrument, other sources of error may remain. One of these error sources is caused by stray radiation or "ghost" reflections within optical systems of the scatterometer. Illuminating radiation and unwanted zero-order radiation enter the optical system. Depending on the target, and conditions such as wavelength and the particular target structure, underlying structures and processes, these unwanted signals can be strong in relation to the higher order diffraction signals that are wanted for use in the measurement. Therefore great care and expense is devoted to minimizing internal reflections and scattering. Of course any optical interface is to some extent reflecting. Anti-reflection coatings will be deployed, but these cannot work perfectly, especially when a wide range of wavelengths are to be used for measurement. Scratches and contamination of surfaces will also lead to scattering and stray radiation. Accordingly, to obtain the best asymmetry measurements across a wide range of wavelengths is still a great challenge for the hardware designer, manufacturer and operator of such instruments.

It is desirable to provide a method and apparatus for dark field metrology, for example to measure asymmetry and/or overlay in target gratings, in which high accuracy can be obtained without further increase in design, manufacture and operating costs. Using known hardware, accuracy can be improved over prior published techniques by including mathematical corrections for stray radiation.

In an aspect, there is provided a method of measuring asymmetry in a periodic structure formed by a lithographic process on a substrate, the method comprising:

a first measurement step comprising forming and detecting a first image of the periodic structure while illuminating the structure with radiation, the first image being formed using a first selected part of diffracted radiation;

a second measurement step comprising forming and detecting a second image of the periodic structure while illuminating the structure with radiation, the second image being formed using a second selected part of the diffracted radiation which is symmetrically opposite to the first part, in a diffraction spectrum of the periodic structure; and calculating a measurement of asymmetry in the periodic structure based on intensity values derived from the detected first and second images, wherein in the step of calculating the asymmetry measurement, a correction is included for reducing an influence of stray radiation arising in the first and second measurement steps.

In order to facilitate the correction, the method in some embodiments further comprises a plurality of calibration measurement steps performed on the same substrate and/or a similar substrate as the first and second measurement steps, the correction being based on results of the calibration measurement steps. The correction required may be strongly dependent on structures and processes applied to an individual substrate and target. Calibration measurements may be made for each substrate, for each batch of substrates, or for all substrates of a similar type and process history. Calibration measurements can be made for different measurement conditions; for example, different wavelengths and polarizations of the radiation may require very different amounts of correction.

The calibration measurements in some embodiments include measurements on at least first and second periodic structures, the first and second periodic structures being formed with known biases in an asymmetry-related parameter. Structures with different biases in overlay or other parameter of interest may be available as part of a typical target, or may be provided specifically for the calibration.

The calibration measurements may for example include:

a first calibration measurement made with the substrate in a first orientation relative to a measurement optical system while illuminating the substrate through a first optical path;

a second calibration measurement made with the substrate in a second orientation relative to the measurement optical system while illuminating the substrate through the first optical path;

a third calibration measurement made with the substrate in the first orientation while illuminating the substrate through a second optical path; and a fourth calibration measurement made with the substrate in the second orientation while illuminating the substrate through the second optical path.

In an embodiment, the first, second, third and fourth calibration measurements are made on each of at least first and second periodic structures, the first and second periodic structures being formed with known biases in an asymmetry-related parameter.

In some embodiments, asymmetry is measured in several periodic structures simultaneously, using structures that are small enough to all fit within a field of view of the measurement optical system. This field of view may be defined, for example, by an illumination spot size.

The first measurement step may be performed with the substrate in a first orientation relative to a measurement optical system, and the second measurement step performed with the substrate in a second orientation. Thus the correction for stray radiation can be applied in so-called substrate rotation mode measurements.

The correction for stray radiation can be applied in other modes, for example in modes where the first and second measurement steps are performed with the substrate in a first orientation relative to a measurement optical system, the first measurement step using a first optical path within the measurement optical system and the second measurement step using a second optical path.

The method may further comprise calculating a performance parameter of the lithographic process based on the asymmetry determined by the method for a plurality of periodic structures. The performance parameter may be for example overlay, focus or dose.

In aspect, there is provided an inspection apparatus configured for measuring asymmetry in a periodic structure on a substrate, the inspection apparatus comprising:

an illumination arrangement operable to deliver conditioned beams of radiation to the substrate for use in measurement steps;

a detection arrangement operable during such measurement steps to form and detect respective images of the substrate using radiation diffracted from the substrate, the illumination arrangement and the detection arrangement forming a measurement optical system;

a stop arrangement within the detection arrangement;

a substrate support operable to support the substrate in at least first and second orientations relative to the illumination arrangement and detection arrangement, wherein the illumination arrangement, the stop arrangement and the substrate support together are operable to select which part of a diffraction spectrum of the diffracted radiation contributes to each image; and a controller programmed to cause the apparatus to obtain corrected measurements of asymmetry of the periodic structure by a method as described herein.

In this way, the correction for stray radiation can be applied in new apparatuses, but also by suitable control of existing optical hardware. Improved measurements can be obtained without the expected expense of improved hardware design and maintenance.

In an aspect, there is provided a computer program product comprising machine readable instructions for causing a programmable processing device to implement a method as described herein. The machine readable instructions may be embodied for example in a non-transitory storage medium.

In aspect, there is provided a lithographic system including a lithographic apparatus and an inspection apparatus as described herein.

In aspect, there is provided a method of manufacturing devices wherein a device pattern is applied to a series of substrates using a lithographic process, the method including measuring asymmetry of at least one periodic structure formed as part of or beside the device pattern on at least one of the substrates using a method as described herein, and controlling the lithographic process for later substrates based on the result of the asymmetry measurement.

Further features and advantages, as well as the structure and operation of various embodiments, are described in detail below with reference to the accompanying drawings.

It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Embodiments of the invention will now be described, by way of example, with reference to the accompanying drawings in which:

FIG. 3A is a schematic diagram of an inspection apparatus according to an embodiment;

FIG. 3F is an example of calculation of asymmetry from intensities of the captured +1 and −1 diffraction orders;

FIG. 4C is an example calculation of overlay as a parameter of interest calculated from asymmetry measurements made using the image of FIG. 4B;

DETAILED DESCRIPTION

Before describing embodiments in detail, it is instructive to present an example environment in which embodiments may be implemented.

Figure 1:
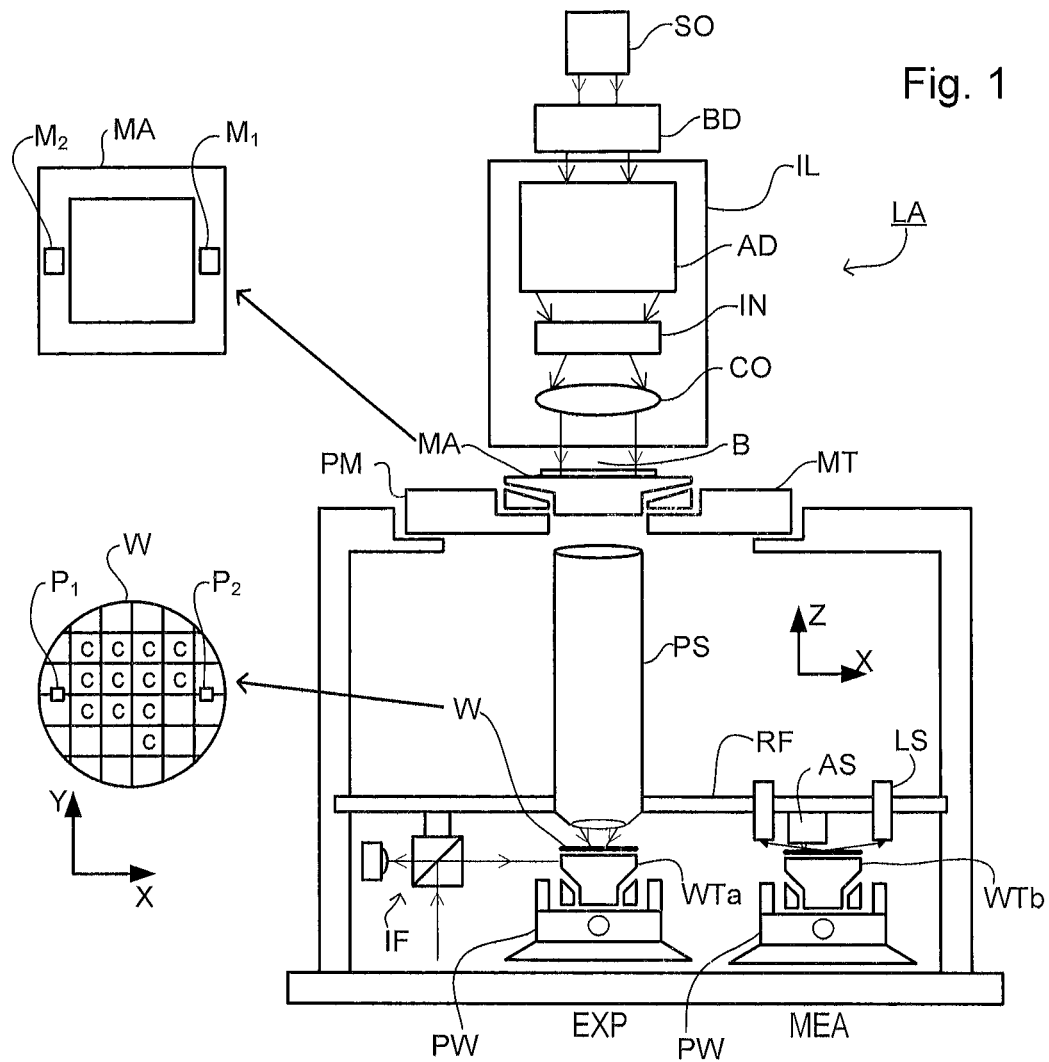
FIG. 1 depicts a lithographic apparatus according to an embodiment.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two tables (e.g., a wafer table) WTa and WTb each constructed to hold a substrate (e.g., a resist coated wafer) W or one constructed hold a substrate and another construct to perform measurements primarily, and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms, The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two tables WTa, WTb and two stations—an exposure station EXP and a measurement station MEA—between which the tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are, for example, docked together when performing preparatory measurements, and then undocked while the substrate table undergoes exposure.

Figure 2:
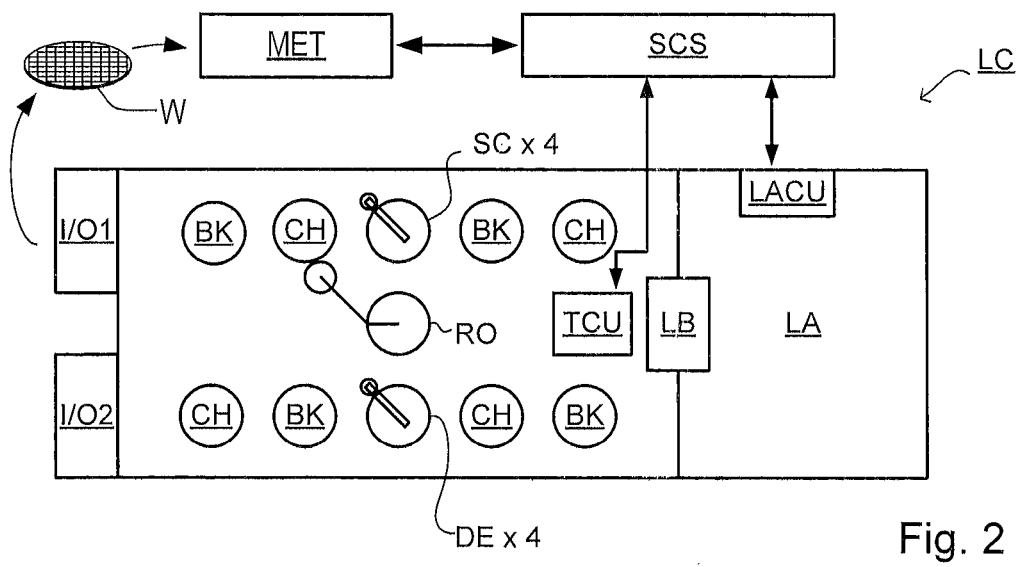
FIG. 2 depicts a lithographic cell or cluster including an inspection apparatus according to an embodiment.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports O/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Example Inspection Apparatus for Small Target Dark Field Metrology

Figure 3B:
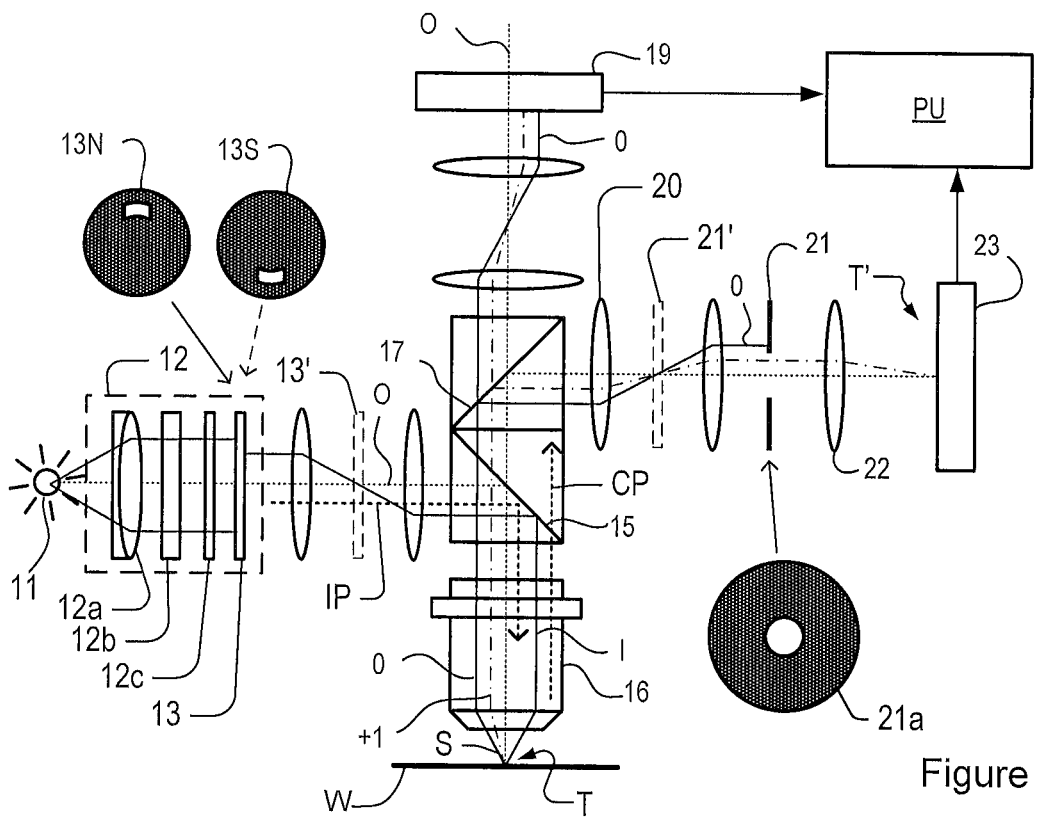
FIG. 3B is a schematic representation of a substrate and target in a first orientation.
Figure 3B:
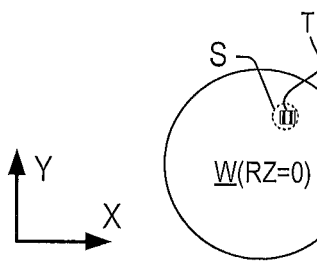

An inspection apparatus adapted to perform dark field metrology is shown in FIG. 3A. A substrate W with target T is shown in different orientations in FIGS. 3B and 3C. A target grating T and diffracted rays are illustrated in more detail in FIGS. 3D and 3E. The dark field metrology apparatus may be a stand-alone device or incorporated in either the lithographic apparatus LA, e.g., at the measurement station, or the lithographic cell LC.

In this type of inspection apparatus, radiation emitted by a radiation source 11 is conditioned by an illumination system 12. For example, illumination system 12 may include a collimating using lens system 12a, a color filter 12b, a polarizer 12c and an aperture device 13. The conditioned radiation follows an illumination path IP, in which it is reflected by partially reflecting surface 15 (e.g., a beam splitter) and focused into a spot S on substrate W via a microscope objective lens 16. A metrology target T may be formed on substrate W. Lens 16 has a relatively high numerical aperture (NA), desirably at least 0.9 and more desirably at least 0.95. Immersion fluid can be used to obtain with numerical apertures over 1 if desired.

When the radiation beam is incident on the partially reflecting surface 15, part of it may be transmitted through the beam splitter and follows a reference path (not shown). Radiation in the reference path is detected for example to measure the intensity of the incident radiation, to allow normalization of the intensity values measured in the scatter spectrum (diffraction spectrum).

Radiation reflected by the substrate, including radiation diffracted by any metrology target T, is collected by lens 16 and follows a collection path CP in which it passes through partially reflecting surface 15 into a detector 19. The detector may be located in the back-projected pupil plane, which is at the focal length of the lens 16. In practice, the pupil plane itself may be inaccessible, and is instead re-imaged with auxiliary optics (not shown) onto the detector located in a so-called conjugate pupil plane. The detector is desirably a two-dimensional detector so that a two-dimensional angular scatter spectrum or diffraction spectrum of a substrate target T can be measured. In the pupil plane or conjugate pupil plane, the radial position of radiation defines the angle of incidence/departure of the radiation in the plane of focused spot S, and the angular position around an optical axis O defines azimuth angle of the radiation.

The various components of illumination system 12 can be adjustable to implement different metrology 'recipes' within the same apparatus. Color filter 12b may be implemented, for example, by a set of interference filters to select different wavelengths of interest in the range of, say, 405-790 nm or even lower, such as 200-300 nm. An interference filter may be tunable rather than comprising a set of different filters. A grating could be used instead of interference filters. Polarizer 12c may be rotatable or swappable so as to implement different polarization states in the radiation spot S. Aperture device 13 can be adjusted to implement different illumination profiles, as described further below. Aperture device 13 is located in a plane conjugate with the pupil plane of objective lens 16 and the plane of the detector 19. In this way, an illumination profile defined by the aperture device defines the angular distribution of radiation incident on substrate radiation passing through different locations on aperture device 13.

A second beam splitter (partially reflecting surface) 17 divides the diffracted beams into two measurement branches. In a first measurement branch, an optical system forms a diffraction spectrum (pupil plane image) of the target on first detector 19 (e.g. a CCD or CMOS sensor) using the zeroth (0) and first order (+1, −1) diffractive beams, as described above. In the second measurement branch, an optical system including lenses 20, 22 forms an image of the target on the substrate W on a second two-dimensional image detector 23 (e.g. a CCD or CMOS sensor). In the second measurement branch, a second aperture device 21 is provided in a plane that is conjugate to the pupil plane. This plane will be referred to as an 'intermediate pupil plane' when describing embodiment herein. Second aperture device 21 functions to block the zeroth order diffracted beam so that the image of the target formed on detector 23 is formed only from the −1 or +1 first order beam. The images captured by detectors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PS. Illumination symmetry and the presence of such aberrations will manifest themselves in a variation in the printed grating. Accordingly, the scatterometry data of the printed gratings is used to measure properties of the gratings. These properties in turn are used to monitor the properties of functional product features formed by the same process, elsewhere on the substrate.

In a particular application of the apparatus, processes are monitored by measurement of asymmetry of features in product and/or target patterns. A particular application of asymmetry measurement is for the measurement of overlay, where the target comprises one set of periodic features superimposed on another. Simply stated, while the positions of the diffraction orders in the diffraction spectrum of the target are determined only by the periodicity of the target, asymmetry of intensity levels in the diffraction spectrum is indicative of asymmetry in the individual features which make up the target.

In the first measurement branch, such asymmetry in the diffraction orders appears directly as asymmetry in the pupil image recorded by detector 19. This asymmetry can be measured by digital image processing unit PU, and calibrated against known values of overlay. The present disclosure, however, is primarily concerned with measurement of asymmetry on small targets by a dark-field imaging technique, using a second measurement branch of the apparatus, as will now be described.

As mentioned, the angular range at which the radiation is incident on the substrate can be selected by defining a spatial intensity distribution in a plane that presents the spatial spectrum of the substrate plane, here referred to as a (conjugate) pupil plane. In particular, this can be done by providing an aperture device 13 of suitable form between lenses 12 and 14, in a plane which is a back-projected image of the objective lens pupil plane. In the example illustrated, changing aperture device 13 allows different apertures, and hence different illumination modes, to be selected. The illustrated form of aperture 13N defines an off-axis illumination from a direction designated, for the sake of description only, as 'north'. In a second illumination mode, aperture 13S is used to provide similar illumination, but from an opposite direction, labeled 'south' Other modes of illumination are possible by using different apertures, some of which will be illustrated below. The rest of the pupil plane is desirably dark, as any unnecessary radiation outside the desired illumination mode will interfere with the desired measurement signals.

Figure 3C:
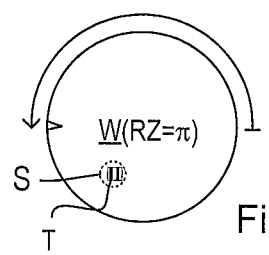
FIG. 3C is a schematic representation of the substrate and target of FIG. 3B in a second orientation.

As shown schematically in FIGS. 3B and 3C, radiation spot S can be placed onto target T in different orientations. To achieve this, a substrate table may be provided to hold the substrate W during measurement operations. The substrate table may be similar or identical in form to the substrate table WTa, WTb in the lithographic apparatus LA, of FIG. 1. (In an example where the inspection apparatus is integrated with the lithographic apparatus, they may even be the same substrate table.) Coarse and fine positioners may be configured to accurately position the substrate in relation to a measurement optical system. Various sensors and actuators are provided for example to acquire the position of a target of interest, and to bring it into position under the objective lens 16. Typically many measurements will be made on targets at different locations across substrate W. The substrate support can be moved in X and Y directions to acquire different targets, and in the Z direction to obtain a desired focusing of the optical system on the target. Rotation of the substrate table about the Z axis is also provided for. It is convenient to think and describe operations as if the illumination spot S is being brought to different locations on the substrate. In the practical implementation of these operations, it is usually more convenient if the optical system remains substantially stationary while the substrate moves. Provided the relative position of the substrate and the optical system is correct, it does not matter in principle whether one or both of them are moving in the real world.

In FIG. 3B, an example target T is brought into spot S in a first orientation, which can be defined by a rotation angle RZ of zero degrees (RZ=0). In FIG. 3C, the same target is brought into spot S with a rotation of 180 degrees (RZ=π in radians). It will be understood that the sizes of spot and target here are greatly exaggerated for the sake of illustration. A real substrate may have many targets distributed across it, for measuring overlay and other parameters at different positions on the substrate. The width (e.g., diameter) of spot S may be for example between 10 and 50 μm, while the target T fits within the spot width in this type of small target metrology. The target is thus referred to as "overfilled".

Figure 3D:
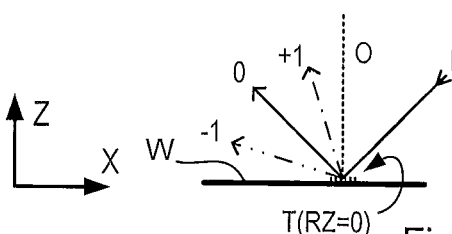
FIG. 3D is a schematic illustration of the capture of a +1 diffraction order with a substrate in the first orientation.
Figure 3E:
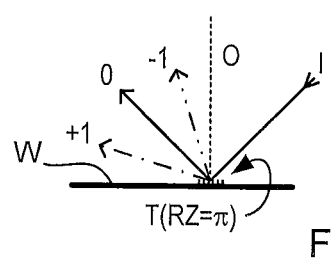
FIG. 3E is a schematic illustration of capture of a −1 diffraction order with the substrate in the second orientation.

FIGS. 3D and 3E show schematically more detail of the diffraction spectrum that results when a periodic structure (grating) of target T is placed into spot S with the substrate W normal to the optical axis O of objective lens 16. In FIG. 3D the orientation RZ=0 is used, while in FIG. 3E the 180 degree rotated orientation is used (RZ=π). A ray of illumination I impinging on grating T from an angle off the axis O gives rise to a zeroth order ray (solid line 0) and two first order rays (single dot-dash line +1 and double dot-dash line −1).

It should be remembered that each of the rays illustrated is just one of many parallel rays falling on the area of the substrate which includes metrology target T and, with an overfilled small target grating, may include other features unrelated to the measurement process. Since the aperture in plate 13 has a finite width (necessary to admit a useful quantity of radiation) the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3A, 3D and 3E are shown somewhat off axis, purely to enable them to be more easily distinguished in the diagram.

At least the 0 and +1 orders diffracted by the target on substrate W are collected by objective lens 16 and directed back through element 15. Returning to FIG. 3A, both the first and second illumination modes are illustrated, by designating diametrically opposite apertures labeled as north (13N) and south (13S). When the incident ray I is from the north side of the optical axis, that is when the first illumination mode is applied using aperture plate 13N, the +1 diffracted rays, which are labeled +1, enter the objective lens 16 when the orientation of the target is the first orientation (RZ=0). In contrast, in the second orientation (RZ=π), −1 diffracted rays are the ones which enter the lens 16.

As illustrated in FIG. 3F, a measurement of asymmetry A can be calculated from the intensities of detected radiation for the +1 and −1 diffraction orders. In the formula:

$$A = I_{+1} - I_{-1}$$

the asymmetry measurement is calculated as a difference between intensities measured for the +1 and −1 orders. For each intensity measurement I, a superscript denotes the orientation RZ (0 or π), while a subscript denotes the diffraction order +1 or −1.

Which portion of the diffraction spectrum is used in formation of an image on detector 23 is a function of the illumination aperture, the imaging branch aperture, the radiation wavelength and the pitch of the periodic structure(s) within the spot. The particular forms of aperture device 13 and second aperture device 21 shown in FIG. 3 are purely examples. Another way to change which portion of the diffraction spectrum enters objective lens 16 without changing the orientation of the target is to change the illumination mode, for example by changing from aperture 13N to aperture 13S. This option will be used in a calibration procedure, explained below. Further alternatives are to change the imaging branch aperture device 21, instead of or in addition to changing the illumination aperture device 13. In other embodiments, some of which will be illustrated and described below, on-axis illumination of the targets is used and an imaging branch aperture device 21 with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial light modulator can be used also. Moving mirrors or prisms can be used as another way to adjust the illumination mode.

While the optical system used for imaging in the present examples has a wide entrance pupil which is restricted by the second aperture device 21, in other embodiments or applications the entrance pupil size of the imaging system itself may be small enough to restrict to the desired order, and thus serve also as the second aperture device. Different aperture plates are shown in FIGS. 3C and 3D which can be used as described further below. For the time being, it is sufficient to consider simply that the aperture plate 13N is used.

Optional components shown in FIG. 3A are an illumination field stop 13' and an imaging branch field stop 21'. Field stops are located in planes conjugate with the target T and the image T', also known as back focal planes or intermediate focal planes. Field stops can be applied to restrict the illuminated and/or imaged field area on the substrate.

Figure 4A:
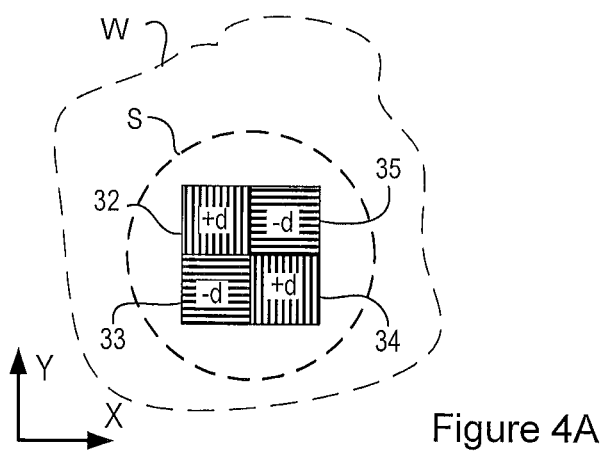
FIG. 4A depicts a form of target and an outline of a measurement spot on a substrate.

FIG. 4A depicts an example composite target formed on a substrate. The composite target comprises four gratings 32 to 35 positioned closely together so that they will all be within a measurement spot S formed by the illumination beam of the metrology apparatus and thus are all simultaneously illuminated and simultaneously imaged on detector 23. In an example dedicated to overlay measurement, gratings 32 to 35 are themselves composite gratings formed by overlying gratings that are patterned in different layers of the semiconductor product formed on substrate W. Gratings 32 to 35 are differently biased in order to facilitate measurement of overlay between the layers in which the different parts of the composite gratings are formed. Also in this example, gratings 32 and 34 have periodicity and overlay bias in the X direction, while gratings 33 and 35 have orientation and overlay bias in the Y direction. In one example, gratings 32 to 35 have biases of +d, −d, +d, −d respectively. Bias +d means that one of the gratings has its components arranged so that if they were both printed exactly at their nominal locations one of the components would be offset relative to the other by a distance d. A bias −d means that an overlay grating has its components arranged so that, if perfectly printed, there would be an offset of d but in the opposite direction to the first grating and so on. While four gratings are illustrated, a practical embodiment might require a larger matrix to obtain the desired accuracy. For example, a 3×3 array of nine composite gratings may have biases −4d, −3d, −2d, −d, 0, +d, +2d, +3d, +4d. Separate images of these gratings can be identified in the image captured by detector 23.

Figure 4B:
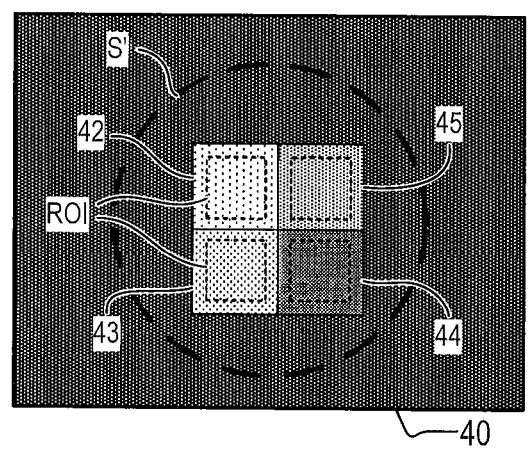
FIG. 4B is a schematic image of the target of FIG. 4A obtained in the inspection apparatus of FIG. 3.

FIG. 4B shows an example of an image that may be formed on and detected by the detector 23, using the target of FIG. 4 in the apparatus of FIG. 3. While the pupil image detector 19 cannot resolve the different individual gratings 32 to 35, the field image detector 23 can do so. The dark rectangle labeled 40 represents the field of the image on the detector 23, within which the illuminated spot S on the substrate is imaged into a corresponding circular area S'. Within this, rectangular areas 42-45 represent the images of the small target gratings 32 to 35. If the gratings are located in product areas, product features may also be visible in this image. Image processor and controller PU processes these images to identify the separate images 42 to 45 of gratings 32 to 35. A region of interest (ROI) can be identified. The identification of the images and the ROI can be done by pattern matching techniques, so that the images do not have to be aligned very precisely at a specific location within the sensor frame. Reducing the need for accurate alignment in this way greatly improves throughput of the measuring apparatus as a whole. However, positional variation may introduce inaccuracies in the measurement results, if the imaging process is subject to non-uniformities across the image field. Not only properties of the various components in the optical path, but also intensity of illumination and sensitivity of detection can vary across the image field. In U.S. patent application publication no. US 2012-0242970, mentioned above, corrections are made in the measured intensities, according to the position at which each grating image is observed within the field of image detector 23. Such corrections can be applied in the techniques of the present disclosure as well.

Once the separate images of the gratings have been identified, the intensities of those individual images can be measured, e.g., by averaging or summing selected pixel intensity values within the identified areas. Intensities and/or other properties of the images can be compared with one another, for example using the formula of FIG. 3F. These results can be combined to measure different parameters of the lithographic process. Overlay performance, which can be measured by measuring asymmetry of a grating target, is an important example of such a parameter.

Referring to FIG. 4C, different targets can be designed so that their asymmetry depends strongly on a parameter of interest for measurement of the lithographic process. For the examples described herein it is assumed that the target is designed for measurement of overlay as a parameter of interest. As shown in the formula at FIG. 4C, a measurement of overlay OV in the vicinity of this target can be calculated as a function of the asymmetries measured for two or more gratings, using knowledge of the different bias values they contain. That is to say, the unknown overlay OV can be calculated using measurements of asymmetry of biased gratings, combined with knowledge of the different biases in the gratings. Noting that the example target of FIG. 3A is a composite target with component gratings in X and Y directions, and having two bias values +d and −d, it will be understood that the target allows measurements of overlay in both X and Y directions to be calculated from measurements of asymmetry of those target gratings. In one example, overlay is calculated by the formula:

$$OV = \frac{p}{2\pi} \cdot a\tan\left(\tan\left(\frac{2\pi d}{p}\right) \cdot \frac{A_{+d} + A_{-d}}{A_{+d} - A_{-d}}\right),$$

where d is the amount of bias and p is the grating pitch. Bias and pitch may be expressed for example in nanometers (nm).

The principles of this measurement are well established, and do not need to be described further herein. However, what will be apparent is that, if any error is present in the measurement of asymmetry of either or both gratings, then the overlay measurement calculated as a function of those asymmetries is also likely to contain errors. In the following discussion, methods of correcting for such errors are illustrated, and in particular for errors caused by stray radiation or "ghost" reflections. This stray radiation may be originating from the rays of incident radiation and zero order reflected radiation, reflecting from internal surfaces of the apparatus, from contamination and so forth. While sophisticated anti-reflective coatings and protection against contamination will be used to minimize stray radiation, neither of these measures can be perfect. This is especially the case when a wide range of different wavelengths may be used. Unlike corrections for asymmetry in the apparatus, the effects of stray radiation may be very different for different types of substrate. For example, the relative strengths of zero order and first order diffracted radiation will depend strongly on the particular processing history, which can result in very different materials and structures being present in, under and around each target. Up to now, therefore, the only way to minimize the effects of stray radiation has been by improved design, manufacturing and maintenance of the apparatus. All of these steps are expensive, and it would be attractive to be able to improve the performance of the existing apparatuses without such expensive steps, if possible.

Correction for Stray Radiation—Principle and Example Calculation

Figure 5:
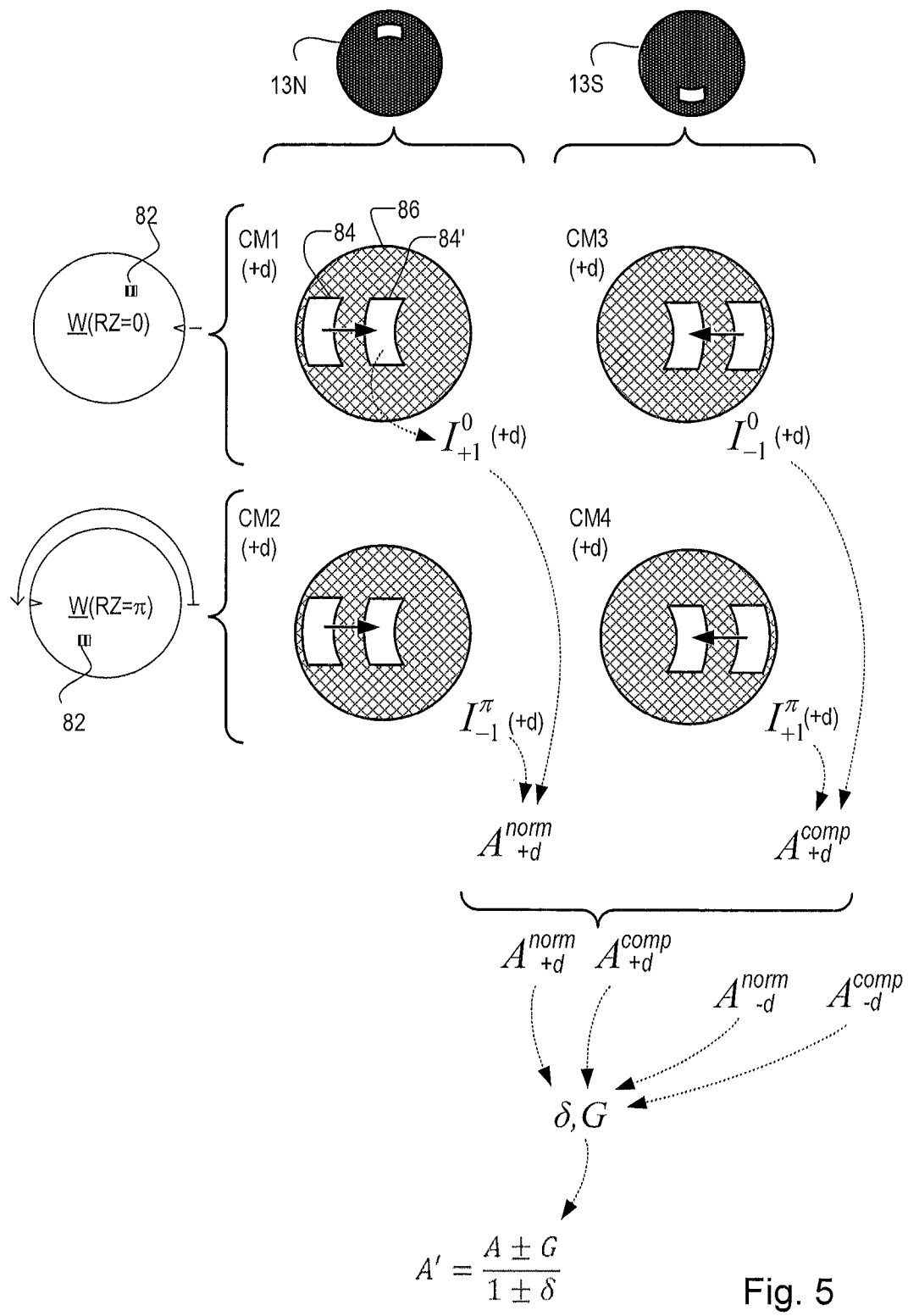
FIG. 5 illustrates the principles of calibration measurements and correction steps that can be applied in the measurement of asymmetry using the apparatus of FIGS. 3 and 4.

FIG. 5 illustrates schematically the principles of correction of stray radiation effects in one example of the present disclosure. In this example, correction values are calculated from the results of calibration measurements performed on two or more biased gratings. These gratings may be the same as the ones whose overlay or other property is to be measured. Alternatively, they may be selected and used purely for the calibration measurements.

In this example, for each biased grating, four calibration measurements are made, and these are represented by pupil images labeled CM1, CM2, CM3, CM4 in the diagram. Each calibration measurement uses a combination of a particular substrate orientation and a particular illumination mode (aperture). These rotations and illumination modes are illustrated, purely schematically and for the sake of example, to the left and above the illustrated measurements. At the left hand side, it can be seen that calibration measurements CM1 and CM3 are made using a first orientation of the substrate (RZ=0). On the other hand, calibration measurements CM2 and CM4 are made with the substrate in a second orientation, that is rotated by 180 degrees (RZ=π). These orientations are the same as those used in the measurement of asymmetry illustrated in FIG. 3.

As shown at the top of the diagram, calibration measurements CM1 and CM2 are made using a first illumination mode, defined by aperture 13N. For the purposes of subsequent measurements using a fixed illumination mode and different orientations, this will be called the "normal" aperture herein. Conversely, calibration measurements CM3 and CM4 are made using aperture 13S, which results in illumination falling from the opposite direction than provided by aperture 13N. For the purposes of this example, this aperture will be referred to as the "complementary" aperture.

In the middle of the diagram, for each calibration measurement, a schematic pupil image shows how the periodic structure of target 82 causes the illuminating radiation 84 to be diffracted to a position 84' in the pupil 86 of the collection path of the apparatus. In calibration measurement CM1, an intensity $I_{-1}^0$ is obtained, representing the +1 order diffracted radiation for the target 82 at 0 degrees rotation. Following the same notation, calibration measurement CM2 obtains the intensity $I_{-1}^\pi$ representing the -1 order diffracted radiation of the target 82 rotated at 180 degrees. Calibration measurement CM3 similarly provides the -1 diffraction order for the 0 degrees rotated target 82, under the second illumination mode. Calibration measurement CM4 provides the +1 diffraction order for the target rotated 180 degrees, under the second illumination mode. For each illumination mode, from these intensity values a nominal asymmetry can be calculated using the formula of FIG. 3F. These are labeled $A^{norm}$ and $A^{comp}$, with superscripts 'norm' and 'comp' referring to the "normal" and "complementary" apertures, respectively.

If there were no asymmetry in the optical system, then these asymmetry values ought to be identical. However, in a real apparatus, asymmetries arise, which should be designed out of the measurement, or somehow corrected to achieve maximum of asymmetry of the target itself. As illustrated, these asymmetry values $A_{+d}^{norm}$ and $A_{+d}^{comp}$ are derived firstly for the component grating having a first bias value, for example +d. Alongside this grating, similar asymmetry values $A_{-d}^{norm}$ and $A_{-d}^{comp}$, can be obtained from intensity values relating to the component grating having a second bias value, for example -d.

In the example illustrated, these four asymmetry values are used to calculate two calibration values labeled δ and G as follows:

$$\delta = \frac{(A_{+d}^{norm} + A_{-d}^{norm}) - (A_{+d}^{comp} + A_{-d}^{comp})}{A_{+d}^{norm} + A_{-d}^{norm} + A_{+d}^{comp} + A_{-d}^{comp}},$$

and $$G = \frac{1}{4}(1-\delta)(A_{+d}^{norm} - A_{-d}^{norm}) - (1+\delta)(A_{+d}^{comp} - A_{-d}^{comp})$$

As illustrated at the foot of FIG. 5, once these calibration values are known for a given substrate, or batch of substrates, corrected asymmetry values A' can be calculated from measured asymmetry values A according to a formula of the general form:

$$A' = \frac{A \pm G}{1 \pm \delta}$$

The full theoretical derivation of this correction is not given here. It is derived from first principles, based on two assumptions. The first assumption is that asymmetry of the apparatus between the 'norm' and 'comp' apertures can be represented by the value δ such that intensities/measured using the normal aperture are in error by a factor (1+δ) and intensities/measured using the complementary aperture are in error by a factor (1−δ). (The value of δ can be positive or negative in practice.) The second assumption is that the apparatus also suffers from additive intensity levels (stray radiation effects) that are fixed over time and position, though they may be different for the different apertures. Modeling the effects of these different error sources when the measured intensity values are used to calculate asymmetries, the value G can be calculated to represent the difference caused by stray radiation.

The above mathematical representation of apparatus asymmetry and stray radiation effects is of course not the only possible model, and other models can be devised. The formula for calculating corrected asymmetry values may be different in that case, and the formulae presented here are presented for the sake of example only.

Thus, in one implementation of the correction, a corrected measurement of asymmetry is obtained by performing an addition or subtraction followed by a division on the asymmetry value calculated from the measured intensities. Of course, depending on the sign conventions and reciprocal conventions, the same correction could be expressed in terms of either an addition or subtraction, followed by either a division or multiplication.

The signs of addition and subtraction of the correction values vary, depending which of the gratings is measured. Thus, for asymmetry measurements made using the 'normal' aperture and different orientations of the target, the correction calculations would be:

$$A'^{norm}_{+d} = \frac{A^{norm}_{+d} - G}{1+\delta}$$

and $$A'^{norm}_{-d} = \frac{A^{norm}_{-d} + G}{1+\delta}$$

For asymmetry measurements made using the 'complementary' aperture and different orientations of the substrate, the correction calculations would be:

$$A'^{comp}_{+d} = \frac{A^{comp}_{+d} + G}{1-\delta}$$

and $$A'^{comp}_{-d} = \frac{A^{comp}_{-d} - G}{1-\delta}$$

As mentioned, each type of target (defined by the target design and the lithographic process by which it is produced) has its own correction values, but similar targets should be amenable to correction using the same values. Consequently, provided that the calibration measurements are made on targets representative of targets to be measured in due course, the actual measurements of asymmetry which would be used to measure performance of the lithographic process do not need to be made four times, but can be made, for example, using a single illumination mode and two orientations of the substrate.

In the example illustrated, the illumination aperture and the gratings are assumed to be oriented in the X direction only. Similar measurements can be made for Y-direction gratings, and correction values for asymmetry in the Y direction can be calculated also. As further illustrated below in the example of FIG. 7, apertures can be designed to illuminate from both X and Y directions simultaneously, so that gratings in periodicity in both the X and the Y directions can be measured simultaneously in images captured by the sensor 23.

Example Process for Measurement of Asymmetry with Stray Radiation Correction

Figure 6:
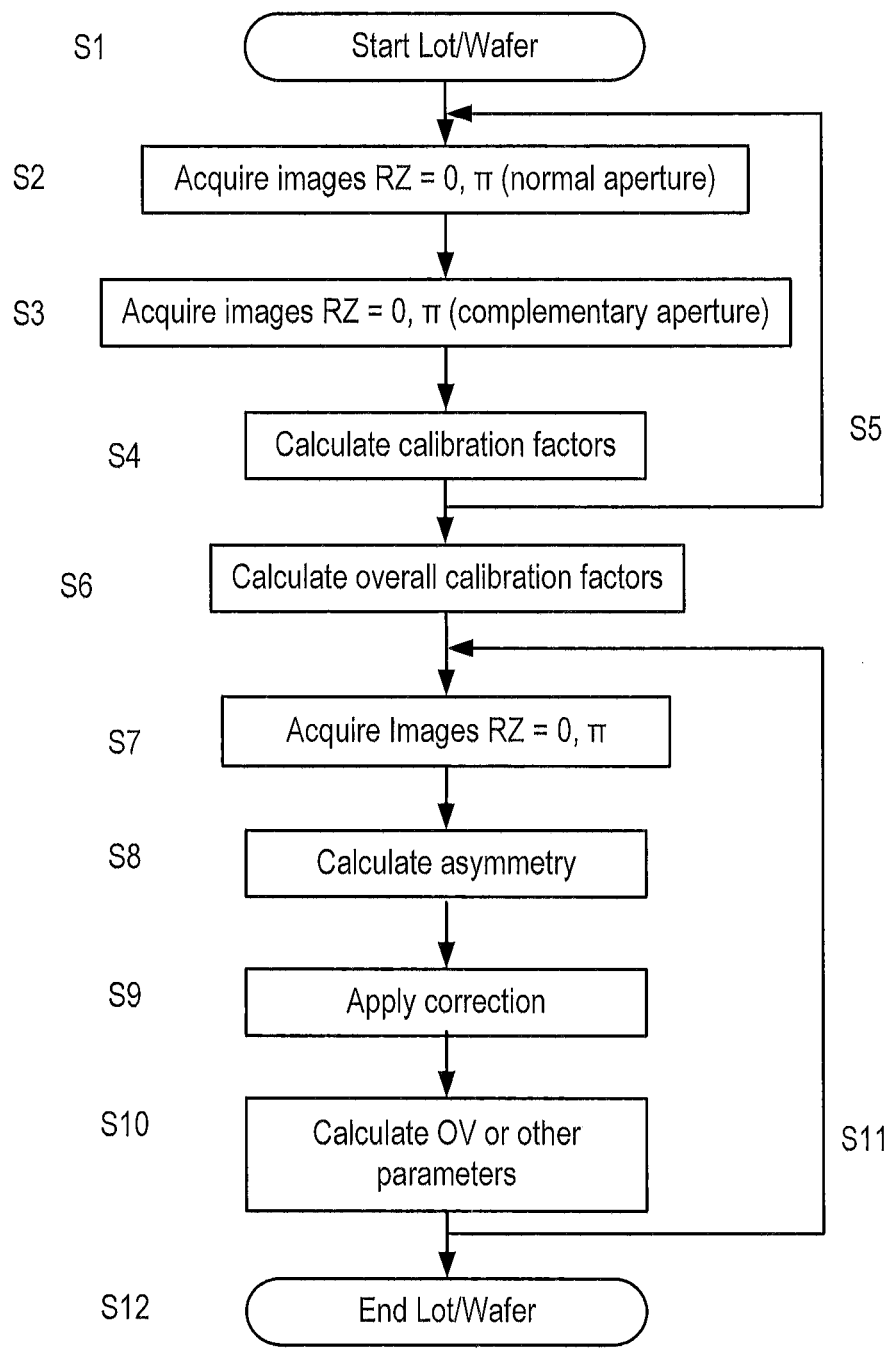
FIG. 6 is a flowchart of a method of measuring corrected measurements of asymmetry using the principles of FIG. 5.

FIG. 6 is a flow chart showing a method of measuring overlay or other parameters, with corrections for stray radiation according to the principles described above. The exact steps and sequence of steps in the flow chart are presented only by way of example, and the same results can be achieved in a number of ways. Some of these variants will be described below. The skilled person will be readily able to conceive other variants. For the sake of example, it will be assumed that substrates to be processed are semiconductor substrates in a high-volume lithographic manufacturing process.

At S1 a substrate or lot (batch) of substrates is presented to the inspection apparatus (scatterometer) of, for example, FIG. 3. The substrates have targets designed for measurement of overlay or other parameters. The targets may for example be composite targets having a design as shown in FIG. 4. At S2 to S6, preliminary steps are performed to obtain calibration values for correcting for stray radiation in subsequent measurements. At steps S7 to S10, actual measurements of asymmetry and asymmetry-related parameters are performed, using the correction for stray radiation. It should be understood that the steps S2 to S6 can be performed before, after or in the course of the further measurements of steps S7 to S10. In the practical instrument, it will take time to rotate the substrate for different measurements. It will take time to switch and stabilize different illumination modes (normal aperture, complementary aperture). It will take a certain amount of time to move the substrate to present different ones of the many targets or a substrate under the objective lens. Bearing in mind all these factors, the sequence of measuring different targets in different modes and orientations ways will normally be optimized to maximize throughput of substrates, rather than following some theoretically 'logical' sequence. An optimized sequence of measurements may not be the sequence strictly indicated by the steps of the flow chart.

At S2, a target is selected to be used for calibration, and images of this target under different orientations are obtained using a first illumination mode (normal aperture). These images are acquired using sensor 23 of the apparatus FIG. 3, for example having the form illustrated in FIG. 4B. These images enable the four calibration measurements CM1 to CM4 of FIG. 5. At S3, images are acquired of the same target with a 0 and 180 degree rotation, using the second illumination mode (complementary aperture). The same calibration measurements are performed on two differently biased gratings. At S4, calibration values δ and G can be calculated from the set of images acquired in steps S2 and S3, according to the principles illustrated in FIG. 5.

At S5 it is indicated that the calibration process may acquire images multiple times and/or acquire images from multiple targets. Given that any measurement is subject to an amount of random noise, the repetition of measurements under the same and/or different conditions allows a more robust calibration. At S6, using the results of these repeated measurements, overall values of the calibration values δ, G, are calculated.

At S7, measurement of images with substrate rotation 0 and 180 degrees is performed on all targets, for which asymmetry is to be measured. At S8, asymmetry is calculated based on the +1 and −1 order intensities obtained from the acquired images. At S9, the corrections based on calibration values δ, G are applied, using the formula shown in FIG. 5. At S10, assuming that asymmetry of the targets is being measured to obtain measurements of performance parameters such as overlay, focus or dose, asymmetry measurements from differently biased targets are combined to calculate the designed parameter. The process repeats at S11 to measure as many targets, and as many substrates, as desired. The process ends at S12 when the substrate or the batch of substrates, has been measured as desired.

As mentioned already, the various image acquisition steps and calculations can be performed in principle in any order. Calibrations can be calculated prior to measurement of intended targets, or all images can be acquired in one sequence, and then subsequently processed to calculate calibrations and corrected asymmetries and parameters of interest.

In all the examples herein, radiation of different wavelengths and polarizations can be used in each measurement, or in sequential measurements, in order to maximize robustness of the measurement results. Correction values δ, G can be obtained and calculated independently for each combination of wavelength and polarization. Stray radiation is likely to have very different intensities at different wavelengths. Reasons for this include firstly that the various anti-reflection coatings that will be provided on elements of the optical system will have varying responses with wavelength, and secondly that the target itself will have varying responses with wavelength.

Where a number of targets are to be measured across the substrate, there are various possibilities for sequencing the measurement to achieve the maximum throughput and accuracy with a given hardware set-up. For example, measurement steps S2 and S3 can be performed for each target, including swapping the illumination mode, before moving to the next target. To minimize the swapping operations, the steps may be performed in the order S2, S3 for one target, and in the order S3, S2 for the next. Alternatively, the step S2 may be performed for all targets on the substrate, or for a certain group of targets, before swapping the illumination mode and performing step S3 for all the targets. The images can be stored in controller PU, or external storage. Provided they are indexed or labeled with their corresponding target ID and illumination mode, the order in which they are obtained is unimportant for their subsequent processing.

In alternative embodiments, the calculations of asymmetry and other parameters of interest can be performed remotely from the inspection apparatus hardware and controller PU. They may be performed for example in a processor within supervisory control system SCS, or in any computer apparatus that is arranged to receive the measurement data from the controller PU of the inspection apparatus. Control and processing of the calibration measurements can be performed in a processor separate from that which performs high-volume calculations using the correction values obtained. All of these options are a matter of choice for the implementer, and do not alter the principles applied or the benefits obtained.

Alternative Modes of Measuring Asymmetry with Stray Radiation Correction

Figure 7:
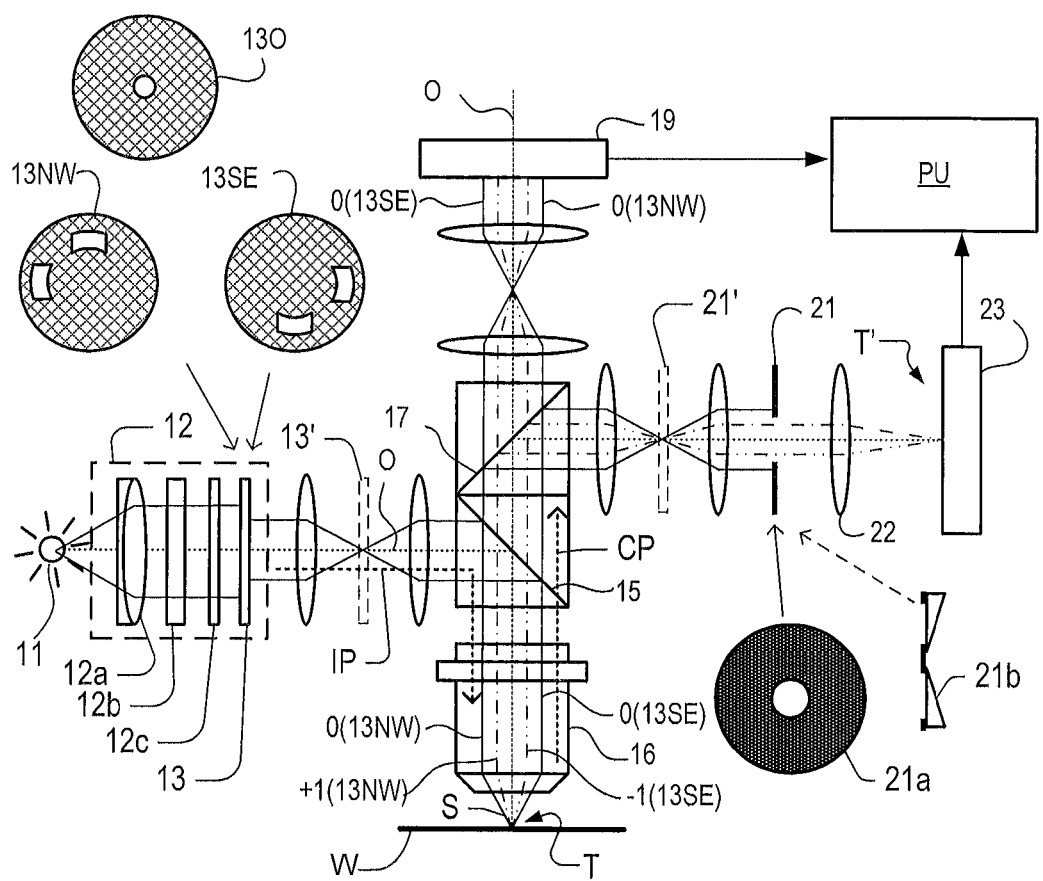
FIG. 7 shows the apparatus of FIG. 3 adapted for different modes of operation.

FIG. 7 illustrates the inspection apparatus of FIG. 3, set up for performing asymmetry measurements using complementary apertures, rather than substrate rotation. In this example, the steps for obtaining measurements of overlay or other parameters can be the same as in FIG. 6, except that step S7 comprises acquiring images with different illumination modes, rather than different rotations of substrate. All the same comments about optimizing the sequence of steps apply in this configuration.

In order to facilitate the different illumination modes, different apertures can be provided by the illumination aperture device 13, and different apertures can be provided by the second aperture device 21. In a first method, the illumination aperture is changed between the forms 13NW as shown, and 13SE as shown. As in the previous example, this provides off-axis illumination at such an angle that the wanted first order radiation in the collection path CP travels substantially on the optical axis. On-axis aperture 21a selects this first order diffracted radiation, which is then used to form an image on sensor 23.

The aperture 13NW provides a first illumination mode with off-axis illumination for both X and Y gratings of the type shown in FIG. 4A. Aperture 13SE provides the second illumination mode, with off-axis illumination complementary to that of aperture 13NW. (The same type of combined X/Y apertures can be used in implementation of the method of FIG. 6, as already mentioned.) As illustrated in FIG. 7, using aperture 13NW, +1 order diffracted radiation is directed along the optical axis in the collection path. Using aperture 13SE, −1 order the diffracted radiation is directed along the optical axis.

Accordingly, by switching the illumination mode, a measurement of asymmetry information can be obtained from images captured by sensor 23, without rotating the substrate. Asymmetry of the inspection apparatus itself is not assured, however, using this method. The illumination paths in the different modes pass through different parts of the apparatus, and are therefore subject to different imperfections. Accordingly, asymmetry measurements based on images captured using these complementary apertures are not immune to asymmetry effects caused by properties of the inspection apparatus.

Figure 8:
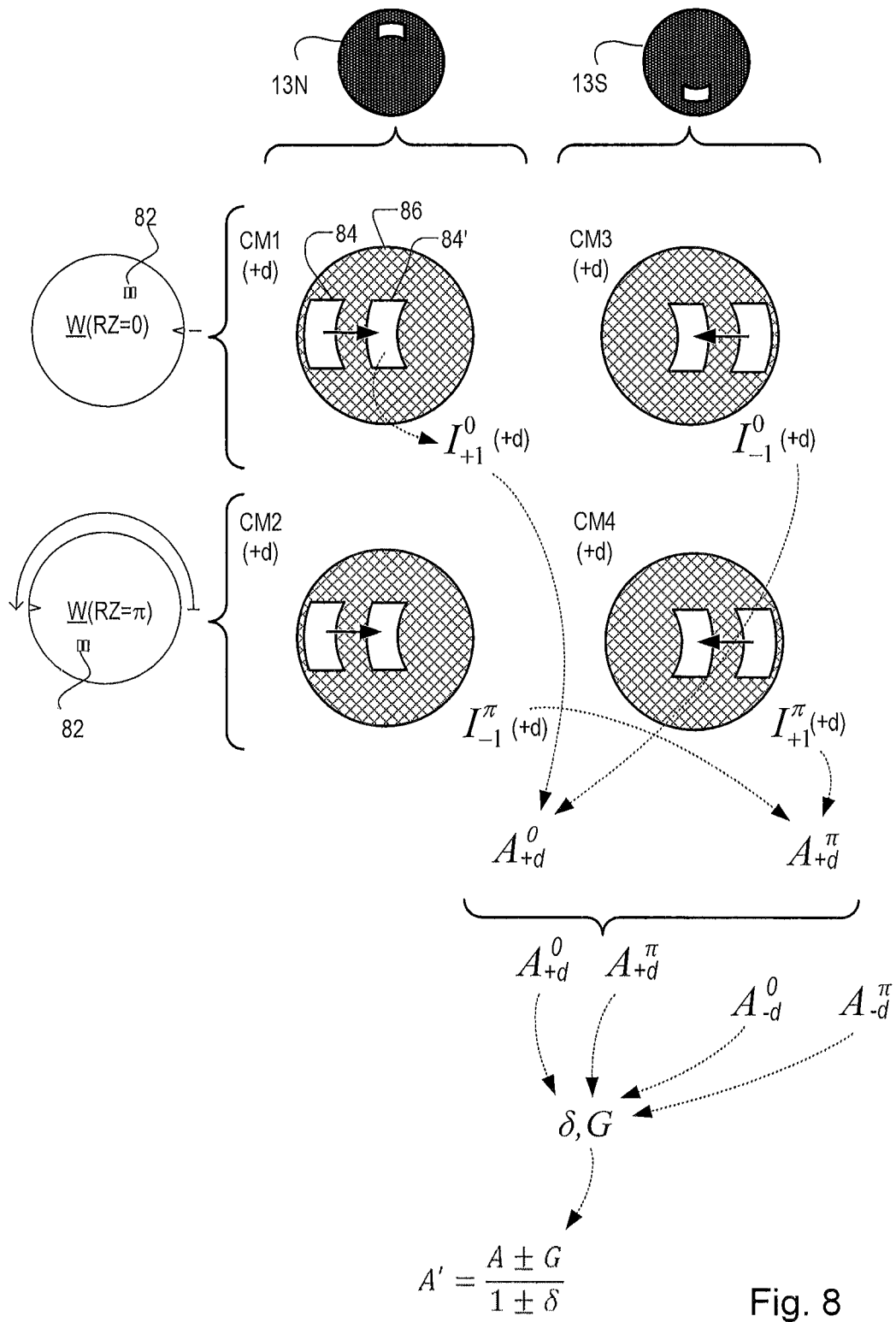
FIG. 8 illustrates the principles of calibration measurements and correction steps of FIG. 5 adapted to the modes of operation shown in FIG. 7.

In the alternative method of asymmetry measurement, in which complementary apertures are used without substrate rotation, calibration steps S2 to S6 are still performed so that measurements are made not only using the complementary apertures, but also using substrate W in rotated positions RZ=0, π. Similar mathematical calculations are made to obtain calibration values δ and G, but with asymmetry values $A^0$ and $A^\pi$ taking the place of $A_{norm}$ and $A^{comp}$ in the calculations. This modification of the calculations is illustrated schematically in FIG. 8. Again, a calculation of the form:

$$A' = \frac{A \pm G}{1 \pm \delta}$$

can be applied to obtain corrected asymmetry measurements in which the effects of both apparatus asymmetry and stray radiation are at least partially corrected. The values of δ and G will be different in this case.

The above two examples are not the only methods for measuring asymmetry using the apparatus of FIGS. 3 and 7. In another mode of operation illustrated in FIG. 7, one uses on-axis illumination, where the illumination aperture has the form shown at 13O in FIG. 7. In this mode, with the appropriate selection of wavelength and grating pitch, it can be arranged that the +1 and −1 orders of diffracted radiation appear in different portions of the pupil plane where second aperture device 21 is positioned in the second measurement branch. In place of the on-axis aperture 21a as the pupil stop, an arrangement of prisms 21b can be substituted. As described in U.S. patent application publication no. US 2011-102753, inclusion of the prism arrangement 21b allows images using the +1 and −1 orders to be formed not in separate acquisition steps, but in separate locations on sensor 23 in the same acquisition step. This saves, measurement time and avoids switching the aperture. Instead of comparing intensities in different images, intensities from different parts of the captured image are compared to obtain asymmetry measurement. Again, while the illumination path is on the axis, in the collection path CP, the +1 and −1 diffracted radiation follow different paths through the optical system of the inspection apparatus. Accordingly, asymmetry due to the apparatus itself can be introduced. Again, δ can be calculated as a calibration value to address this asymmetry, as well as calibration value G being used to reduce the influence of stray radiation.

In addition to modes wherein the illumination is on-axis and the +1 and −1 orders are detected off-axis, and modes of operation where illumination is off-axis and the diffraction orders are detected on the optical axis, modes are available in which illumination is off-axis and the diffraction orders are also off-axis, in the opposite direction. The spacing between the illuminating ray I and the +1 and −1 diffracted radiation depends on a particular combination of radiation wavelength and grating pitch which is employed, as is well known. In general, asymmetry of the apparatus will be a factor in the measured asymmetry, whenever the +1 and −1 diffracted radiation have followed different parts through the optical system of the inspection apparatus, whether those different parts are in the illumination path IP, the collection path CP or both paths. The principles explained above can be applied to the correction of stray radiation in these methods.

CONCLUSION

The corrections taught above enable asymmetry measurements to be made by dark field imaging methods with enhanced accuracy, due to the correction to reduce the influence of stray radiation. Experiments show significant improvements using real data. Additionally, the same calibration measurements can be applied to correcting apparatus asymmetry, while using opposite illumination angles or imaging angles without any substrate rotation. The use of small targets allows simultaneous readout of two or gratings at different positions within the illumination spot.

While specific embodiments of the invention have been described above, it will be appreciated that the invention may be practiced otherwise than as described.

While overlay gratings are a common example, other parameters of the lithographic process can also be measured, designing targets whose asymmetry depends on those other performance parameters, rather than overlay. In this regard, it has previously been disclosed that targets can be designed in which asymmetry of a grating structure is sensitive to variations in focus during an exposure step of the lithographic process. Knowing the relationship between focus and asymmetry, in particularly by using gratings with different bias values for their sensitivity, focus measurements can be derived by observing asymmetry in targets of this type. Similarly, targets can be devised in which asymmetry is sensitive to the dose variations in the lithographic process. Using such targets, dose variations across the substrate or between substrates can be measured based on measurements of asymmetry of the type already described. All these different types of targets can be provided on the same substrate, if desired, to provide comprehensive information on the performance of the lithographic process. Using the image-based diffraction based measurement systems described herein, very compact targets can be provided, so that such measurements do not unduly impact the space available for functional product features on the same substrate.

The calculation of corrections above is applied at the stage of calculating asymmetry, before combining asymmetry values to calculate a parameter of interest such as overlay. The techniques described above can be performed to calibrate and then correct the asymmetry measurements, according to the performance of the tool optical system in different modes of illumination and/or imaging. If the measurement process uses different wavelengths and/or polarizations of radiation, then calibration can be performed for these separately.

While the inspection apparatus or tool illustrated in the embodiments comprises a particular form of scatterometer having first and second branches for simultaneous imaging of pupil plane and substrate plane by parallel image sensors, alternative arrangements are possible. Rather than provide two branches permanently coupled to objective lens 16 with beam splitter 17, the branches could be coupled selectively by a movable optical element such as a mirror. The optical system could be made having a single image sensor, the optical path to the sensor being reconfigured by movable elements to serve as a pupil plane image sensor and then a substrate plane image sensor.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the inspection apparatus hardware and suitable periodic structures of the targets as realized on substrates and patterning devices, an embodiment may include a computer program containing one or more sequences of machine-readable instructions implementing methods of measurement of the type illustrated above to obtain information about a lithographic process. This computer program may be executed for example within controller PU in the apparatus of FIG. 3 and/or the control unit LACU of FIG. 2. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
a first measurement comprising forming and detecting a first image of a periodic structure formed by a lithographic process on a substrate while illuminating the structure with radiation, the first image being formed using a first selected part of diffracted radiation;
a second measurement comprising forming and detecting a second image of the periodic structure while illuminating the structure with radiation, the second image being formed using a second selected part of the diffracted radiation, which second selected part is symmetrically opposite to the first part in a diffraction spectrum of the periodic structure; and
calculating a measurement of asymmetry in the periodic structure based on intensity values derived from the detected first and second images,
wherein in calculating the asymmetry measurement, a correction is included for reducing an influence of stray radiation arising in the first and second measurements.

2. The method as claimed in claim 1, wherein the correction comprises a calculation of the form:

$$A' = \frac{A \pm G}{1 \pm \delta}$$

where A' is a corrected asymmetry value, A is an uncorrected asymmetry value and δ and G are correction values.

3. The method as claimed in claim 1, further comprising a plurality of calibration measurements performed on the same substrate and/or a similar substrate as the first and second measurements, the correction being based on results of the calibration measurements.

4. The method as claimed in claim 3, wherein the calibration measurements include measurements on at least first and second periodic structures, the first and second periodic structures being formed with known biases in an asymmetry-related parameter.

5. The method as claimed in claim 4, wherein calibration measurements are made on the first and second periodic structures in parallel, images of different periodic structures being separable in an image field of a measurement optical system.

6. The method as claimed in claim 3, wherein the calibration measurements include at least:
a first calibration measurement made with the substrate in a first orientation relative to a measurement optical system while illuminating the substrate through a first optical path;
a second calibration measurement made with the substrate in a second orientation relative to the measurement optical system while illuminating the substrate through the first optical path;
a third calibration measurement made with the substrate in the first orientation while illuminating the substrate through a second optical path; and
a fourth calibration measurement made with the substrate in the second orientation while illuminating the substrate through the second optical path.

7. The method as claimed in claim 6, wherein the first, second, third and fourth calibration measurements are made on each of at least first and second periodic structures, the first and second periodic structures being formed with known biases in an asymmetry-related parameter.

8. The method as claimed in claim 1, wherein the first measurement is performed with the substrate in a first orientation relative to a measurement optical system, and the second measurement is performed with the substrate in a second orientation.

9. The method as claimed in claim 1, wherein the first and second measurements are performed with the substrate in a first orientation relative to a measurement optical system, the first measurement using a first optical path within the measurement optical system and the second measurement using a second optical path.

10. The method as claimed in claim 1, wherein the first and second measurements are performed on a plurality of periodic structures in parallel, images of different periodic structures being separable in an image field of a measurement optical system.

11. The method as claimed in claim 10, further comprising calculating a performance parameter of the lithographic process based on the asymmetry determined by the method for a plurality of periodic structures.

12. A method of manufacturing devices wherein a device pattern is applied to a series of substrates using a lithographic process, the method including inspecting at least one periodic structure formed as part of or beside the device pattern on at least one of the substrates using the method as claimed in claim 1, and controlling the lithographic process for later substrates in accordance with a result of the calculating the measurement of asymmetry.

13. A system comprising:
an inspection apparatus configured to measure asymmetry in a periodic structure on a substrate, the inspection apparatus comprising:
an illumination arrangement configured to deliver a conditioned beam of radiation to the substrate for use in measurements;
a detection arrangement configured to, during measurements, form and detect respective images of the substrate using radiation diffracted from the substrate, the illumination arrangement and the detection arrangement forming a measurement optical system;
a stop device within the detection arrangement;
a substrate support configured to support the substrate in at least first and second orientations relative to the illumination arrangement and the detection arrangement, wherein the illumination arrangement, the stop device and the substrate support together are operable to select which part of a diffraction spectrum of the diffracted radiation contributes to each image; and
a controller programmed to obtain corrected measurements of asymmetry of periodic structures by:
using the inspection apparatus, causing a first measurement comprising forming and detecting a first image of the periodic structure while illuminating the structure with radiation, the first image being formed using a first selected part of diffracted radiation, using the inspection apparatus, causing a second measurement comprising forming and detecting a second image of the periodic structure while illuminating the structure with radiation, the second image being formed using a second selected part of the diffracted radiation, which second selected part is symmetrically opposite to the first part in a diffraction spectrum of the periodic structure, and calculating a measurement of asymmetry in the periodic structure based on intensity values derived from the detected first and second images, wherein in calculating the asymmetry measurement, a correction is included for reducing an influence of stray radiation arising in the first and second measurements.

14. The apparatus as claimed in claim 13, wherein the illumination arrangement, the stop device and the substrate support together are operable to perform measurements on at least first and second periodic structures in parallel, images of different periodic structures being separable in an image field of a measurement optical system.

15. A lithographic system comprising:
a lithographic apparatus comprising:
an illumination optical system arranged to illuminate a pattern, and
a projection optical system arranged to project an image of the pattern onto a substrate; and
an inspection system as claimed in claim 13,
wherein the lithographic apparatus is arranged to use the measurement results from the inspection system, including the correction, in applying the pattern to further substrates.

16. A non-transitory computer program product comprising machine readable instructions configured to cause a programmable processing device to:
cause a first measurement comprising forming and detecting a first image of the periodic structure while illuminating the structure with radiation, the first image being formed using a first selected part of diffracted radiation;
cause a second measurement comprising forming and detecting a second image of the periodic structure while illuminating the structure with radiation, the second image being formed using a second selected part of the diffracted radiation which second selected part is symmetrically opposite to the first part, in a diffraction spectrum of the periodic structure; and
calculate a measurement of asymmetry in the periodic structure based on intensity values derived from the detected first and second images,
wherein in calculating the asymmetry measurement, a correction is included for reducing an influence of stray radiation arising in the first and second measurements.

17. A method of calculating a correction to be applied when using an inspection apparatus to measure asymmetry of a periodic structure formed on a substrate, the method comprising:
receiving results of a plurality of calibration measurements performed on the same substrate and/or a similar substrate; and
calculating a correction to reduce an influence of stray radiation arising in the inspection apparatus when measuring asymmetry, the correction being based on results of the calibration measurements.

18. The method as claimed in claim 17, wherein the calibration measurements include measurements on at least first and second periodic structures, the first and second periodic structures being formed with known biases in an asymmetry-related parameter.

19. The method as claimed in claim 17, wherein the calibration measurements include at least:
a first calibration measurement made with the substrate in a first orientation relative to a measurement optical system while illuminating the substrate through a first optical path;
a second calibration measurement made with the substrate in a second orientation relative to the measurement optical system while illuminating the substrate through the first optical path;
a third calibration measurement made with the substrate in the first orientation while illuminating the substrate through a second optical path; and
a fourth calibration measurement made with the substrate in the second orientation while illuminating the substrate through the second optical path.

20. The method as claimed in claim 19, wherein the first, second, third and fourth calibration measurements are made on each of at least first and second periodic structures, the first and second periodic structures being formed with known biases in an asymmetry-related parameter.

* * * * *